(12) United States Patent
Bunyan et al.

(10) Patent No.: US 6,303,180 B1
(45) Date of Patent: Oct. 16, 2001

(54) FORM-IN-PLACE EMI GASKETS (75) Inventors: Michael H. Bunyan; John P. Kalinoski, both of Chelmsford, MA (US)

(73) Assignee: Parker-Hannifin Corporation, Cleveland, OH (US)

(*) Notice: Subject to any disclaimer, the term of this patent is extended or adjusted under 35 U.S.C. 154(b) by 0 days.

(21) Appl. No.: 08/936,497

(22) Filed: Sep. 18, 1997

Related U.S. Application Data (63) Continuation of application No. 08/375,853, filed on Jan. 20, 1995, now abandoned, which is a continuation-in-part of application No. 08/119,403, filed on Sep. 10, 1993, now abandoned.

(51) Int. Cl.$^7$ ........................................................ B05D 5/12
(52) U.S. Cl. ............................ 427/58; 427/77; 427/197; 427/201; 427/385.5
(58) Field of Search .............................. 427/58, 77, 197, 427/201, 385.5

(56) References Cited

U.S. PATENT DOCUMENTS

| | | |
|---|---|---|
| 2,796,457 | 6/1957 | Stinger . |
| 3,032,528 | 5/1962 | Nitzsche et al. . |
| 3,126,440 | 3/1964 | Goodloe . |
| 3,140,342 | 7/1964 | Ehrreich et al. . |
| 3,752,899 | 8/1973 | Bakker . |
| 3,880,627 | 4/1975 | Morton . |
| 3,889,043 | 6/1975 | Ducros . |
| 4,011,360 | 3/1977 | Walsh ................................... 428/402 |
| 4,037,009 | 7/1977 | Severinsen ........................... 428/241 |
| 4,295,573 | 10/1981 | Terry et al. ........................... 215/348 |

(List continued on next page.)

FOREIGN PATENT DOCUMENTS

| | | |
|---|---|---|
| A-63355/94 | 12/1994 | (AU) . |
| 1116650 | 1/1982 | (CA) . |
| 2125742 | 12/1994 | (CA) . |
| 8912397.2 | 1/1990 | (DE) . |
| 4219915 | 12/1993 | (DE) . |
| 4237217 | 5/1994 | (DE) . |
| 9404291.8 | 7/1994 | (DE) . |
| 182391 | * 5/1986 | (EP) . |
| 0182391 | 5/1986 | (EP) . |
| 0194230 | 9/1986 | (EP) . |
| 0200296 | 12/1986 | (EP) . |
| 0241192 | 10/1987 | (EP) . |
| 0326704 | 8/1989 | (EP) . |
| 326704 | * 8/1989 | (EP) . |
| 0588321 | 3/1994 | (EP) . |
| 0 629 114 A1 | 12/1994 | (EP) . |
| 0 643 552 A1 | 3/1995 | (EP) . |
| 2480488 | 10/1981 | (FR) . |
| 2115084 | 9/1983 | (GB) . |
| 2 261 324 A | 5/1993 | (GB) ............................... H05K/9/00 |
| 7-112296 | 1/1993 | (JP) . |

OTHER PUBLICATIONS

Chomerics Technical Bulletin 46, (1 page) 1987.

Chomerics Technical Bulletin E46, (1 page) 1990.

Dynafoam™ Technical Guide, Mar. 1992.

King, G.D., SAE Technical Paper Series, "Improved Foam In Place Gasketing Material", Feb. 26–Mar. 2, 1990.

*Primary Examiner*—Brian K. Talbot
(74) *Attorney, Agent, or Firm*—Ropes & Gray (57) ABSTRACT

A form-in-place, electrically-conductive gasket is disclosed. The gasket, foamed, gelled or unfoamed is made of one or more elastomer resins, such as silicone urethane and/or thermoplastic block copolymers and is either filled with a conductive filler and lined onto a desired substrate or lined onto the substrate unfilled and then coated with a conductive outer layer, such as a silver filled elastomer or a conductive flocked layer. A process and system for making the gaskets are also disclosed.

28 Claims, 5 Drawing Sheets

U.S. PATENT DOCUMENTS

| | | | |
|---|---|---|---|
| 4,434,541 | 3/1984 | Powers, Jr. | 29/526 R |
| 4,507,359 | 3/1985 | Powers, Jr. | 428/328 |
| 4,643,863 | 2/1987 | Martini | 264/219 |
| 4,643,864 * | 2/1987 | Martini | 264/220 |
| 4,643,924 | 2/1987 | Uken et al. | 428/35 |
| 4,662,967 * | 5/1987 | Bogan et al. | 156/242 |
| 4,664,971 | 5/1987 | Soens | 428/288 |
| 4,678,716 | 7/1987 | Tzeng | 428/551 |
| 4,678,863 | 7/1987 | Reese et al. | 174/356 |
| 4,690,831 | 9/1987 | Uken et al. | 427/44 |
| 4,734,140 | 3/1988 | Tzeng | 148/126.1 |
| 4,769,280 | 9/1988 | Powers, Jr. | 428/328 |
| 4,779,762 | 10/1988 | Klein et al. | 222/52 |
| 4,857,668 | 8/1989 | Buonanno | 174/35 G |
| 4,861,643 * | 8/1989 | Scollard | 428/162 |
| 4,865,905 | 9/1989 | Uken | 428/220 |
| 4,869,954 | 9/1989 | Squitieri | 428/283 |
| 4,882,089 | 11/1989 | Iwaskow et al. | 428/242 |
| 4,900,877 | 2/1990 | Dubrow et al. | 174/35 G |
| 4,915,985 * | 4/1990 | Maxfield et al. | 427/126.6 |
| 4,931,326 | 6/1990 | Weil | 428/35.8 |
| 4,931,479 | 6/1990 | Morgan | 521/76 |
| 4,948,922 | 8/1990 | Varadan et al. | 174/35 G |
| 4,977,295 | 12/1990 | Chin et al. | 174/35 G |
| 5,008,485 | 4/1991 | Kitagawa | 174/35 G |
| 5,045,635 | 9/1991 | Kaplo et al. | 174/35 G |
| 5,047,260 * | 9/1991 | Durand | 427/54.1 |
| 5,049,332 | 9/1991 | Ziemer et al. | 264/104 |
| 5,068,493 | 11/1991 | Benn, Sr. et al. | 174/35 G |
| 5,107,070 | 4/1992 | Benn, Sr. et al. | 174/35 G |
| 5,115,104 | 5/1992 | Bunyan | 174/35 G |
| 5,137,766 | 8/1992 | Mazanek et al. | 174/35 G |
| 5,187,225 | 2/1993 | Kitagawa | 524/847 |
| 5,202,536 | 4/1993 | Buonanno | 174/35 G |
| 5,250,607 | 10/1993 | Comert et al. | 524/507 |
| 5,256,480 | 10/1993 | Inoue et al. | 428/331 |
| 5,284,888 * | 2/1994 | Morgan | 524/93 |
| 5,473,111 * | 12/1995 | Hattori et al. | 174/35 R |

* cited by examiner

FORM-IN-PLACE EMI GASKETS

This application is a continuation of U.S. application Ser. No. 08/375,853, filed Jan. 20, 1995, now abandoned, which is a continuation-in-part of U.S. application Ser. No. 08/119,403, filed Sep. 10, 1993, abandoned, both incorporated herein by reference.

FIELD OF THE INVENTION

The present invention relates to electrically-conductive polymeric compositions, and more particularly to form-in-place EMI shielding gaskets and methods for forming such gaskets.

BACKGROUND OF THE INVENTION

EMI shielding gaskets are used on electronic equipment to provide protection against interference from electromagnetic energy, including radio frequency interference (RFI) and more broadly all bands of interference commonly called electromagnetic interference (EMI). The shielding gasket has an electrically conductive element, be it a wire mesh, conductive filler or conductive plating, coating or fabric which prevents external EMI from interfering with an electronic device and/or protects other adjacent electronic devices from EMI emitted by an electronic device.

Typically, EMI gaskets are prepared in one of three configurations: linear, die cut or molded. By linear, it is meant as an extrusion, molding, etc. of a defined, straight length. By die cut, it is meant that a gasket configuration is formed from an electrically conductive elastomer sheet material which is cut by a die to the desired shape, such as round, square, etc. By molded, it is meant that the gasket configuration is formed by placing uncured elastomer which may contain conductive filler or a conductive mesh, into a specifically designed mold which then is subjected to compression (pressure) and then cured to cause the elastomer to assume the desired gasket configuration.

All three methods have disadvantages especially when used to form complex multidirectional or multiaxial gaskets, such as may occur in devices with a number of compartments that each need to be shielded, from each other as well as the external environment. Moreover, the problems are even more critical on smaller devices, such as cellular phones, notebook computers and other hand held devices, where the diameter of the gasket becomes very small and the ability to manufacture and attach such gaskets securely becomes very difficult and labor intensive.

Using linear gasketing material to form complex multiaxis/multidirectional gaskets (e.q. either x and y or in the x, y and z planes), is difficult, time consuming and costly. Each gasket portion must be hand cut and bonded to the adjacent portions of other linear gaskets and then bonded or secured in position upon the substrate.

Die cutting of conductive sheet stock will work in many instances especially in two plane (e.g. flat; x,y) applications, provided that each portion of the gasket is wide enough and/or thick enough to be self supportive. Die cutting parts however results in significant waste of the sheet stock because the material is typically a cross-linked resin such as silicone or polyurethane. This is not acceptable as it drives up the cost of such parts unacceptably. Further as die cutting is a rough process, the sheet stock needs to be fairly stiff and self supportive which is opposite that desired by the gasket user (i.e. soft and flexible).

Molding is slow and again generates scrap in the form of flash which must be removed. Furthermore, each gasket design must use a specifically designed mold, making the process expensive for all but large volume stock items.

A form-in-place EMI gasket and system for forming complex multiaxis/multidirectional EMI gaskets which generates a minimum of scrap, which forms the gasket in place and requires no special tooling is desired. The present invention provides such a system.

SUMMARY OF THE INVENTION

The present invention relates to an EMI shielding material that can be used to form a form-in-place EMI gasket, and a system for forming such a gasket using a table and/or dispenser capable of moving in multiaxial directions relative to each other and a substrate to be gasketed. The invention also relates to a process of providing a conductive elastomer, forming it in place along a desired gasket configuration so as to create a form-in-place EMI gasket.

According to one embodiment the invention provides EMI shielding material defined in part by a polymeric thermal addition cure system including an electrically-conductive filler. According to this and other embodiments, the polymeric system can include an elastomer base. The material desirably has bulk resistivity of less that about 0.050 ohm cm, and is readily extrudable. Upon exposure to a temperature of at least 85° C. for a period of time of at least 30 minutes the material becomes essentially thermoset. The polymeric thermal addition cure system is defined, according to one aspect, by a first species having a first functional group, a second species having a second functional group that is reactive with the first functional group in the presence of a catalyst and heat, and a catalyst having catalytic action that in the presence of heat catalyzes a reaction between the first and second functional groups.

According to one embodiment of the invention the electrically-conductive filler inhibits the catalyst to adversely affect the catalytic activity of the catalyst, yet the catalyst is present in an amount sufficient to retain desired catalytic activity. Methods and arrangements for retaining the catalyst in an amount sufficient to retain catalytic activity are provided, and according to one the shielding material is packaged as a kit. The kit includes a first container containing a first pre-mixed component including the first species, the electrically-conductive filler, and the catalyst, a second container containing a second pre-mixed component including the first species, the second species, and the electrically-conductive filler. The kit includes as well a third container containing the catalyst. By this arrangement, the third container is used to replenish catalyst that is inhibited by the electrically-conductive filler. By "inhibited" is meant chemically or physically affected in a way that catalytic activity is reduced.

According to one embodiment of the invention an EMI shielding material includes a siloxane polymer including vinyl functional groups, a siloxane cross-linker including reactive hydrides, a silver-containing electrically-conductive filler, and a platinum catalyst. The silver-containing electrically-conductive filler inhibits the platinum catalyst, thus methods and arrangements of the invention provide for replenishment of the catalyst to insure that sufficient catalytic action can be provided.

According to another embodiment of the invention a method of making an EMI shielding gasket is described. The method includes extruding onto a substrate a free-form polymeric thermal addition cure system, which includes an electrically-conductive filler and which preferably has a viscosity of from about 100,000 to about 10,000,000 centipoise, more preferably from about 1,000,000 to about 4,000,000 centipoise. The system then is heated at a temperature and for a period of time sufficient to cure the system, thereby forming a gasket having bulk resistivity of less that about 0.050 ohm cm. The gasket can be formed without applying pressure, for example with a mold, to the to the extrudate. Prior to the extruding step, according to one aspect, the polymeric thermal addition cure system is prepared by forming a mixture of a first species having a first functional group, a second species having a second functional group that is reactive with the first functional group in the presence of a catalyst and heat, a catalyst that catalyzes a reaction between the first and second functional groups, and the electrically-conductive filler.

According to one aspect of the method, the polymeric addition cure system is prepared by mixing together a first pre-mixed component and a second pre-mixed component. The first pre-mixed component includes the first species, the electrically-conductive filler, and the catalyst. The second pre-mixed component includes the first species, the second species, and the electrically-conductive filler. Prior to mixing together the first and second components, additional catalyst can be added to the first pre-mixed component. This arrangement can be used when the catalyst has catalytic action that in the presence of heat catalyzes a reaction between the first and second functional groups, and the electrically-conductive filler inhibits the catalyst to adversely affect the catalytic activity of the catalyst.

The invention also provides an EMI shielded substrate. The shielded substrate includes a first electrically conductive substrate, a second electrically conductive substrate adjacent to the first substrate, and a formed-in-place electrically conductive gasket formed on and bonded to a predetermined portion of the first substrate so as to provide an electrical connection and EMI shielding between the first and second substrates. According to one aspect the first substrate is an enclosure and the second substrate is a cover for the enclosure. The first and second substrates can be formed of an electrically conductive material such as metal, metal plated plastic, metal/plastic laminate and composite, coated plastisol, or any combination of these. The gasket can be formed of an elastomer resin and rendered electrically conductive by the incorporation of one or more conductive fillers into the resin. The gasket can include more than one layer, with at least an outer layer being electrically conductive.

According to one embodiment the EMI shielded substrate includes a substrate having an electrically conductive surface, a cover for the substrate, the cover having an electrically conductive surface which corresponds to and is in register with the conductive surface of the substrate, and a formed in place electrically conductive gasket formed on and bonded to a predetermined portion of the conductive surface of the substrate or cover so as to provide an electrical connection and EMI shielding between the substrate and cover upon the mating of the cover to the substrate.

According to another embodiment of the invention a form-in-place EMI gasket is provided that includes a composition formed of a silicone resin, one or more conductive fillers, and a curing agent for the resin. The composition, when mixed and applied to a substrate, will create a form stable, form-in-place gasket capable of providing EMI shielding of from about 10 dB to about 120 dB over a frequency range from 10 MHz to 12 GHz.

According to another embodiment the invention provides an EMI gasket that is made of a composition formed of a first component which is a primary polymer having end groups that are capable of chemically reacting with each other in the presence of moisture to form a derivative polymer having a longer average chain length than said primary polymer, a second component which is a noncross-linked elastomer that is not substantially chemically reactive with itself or with said first component, and a third component which is one or more electrically conductive fillers. When the first, second, and third components are intimately mixed, the composition, when maintained in the absence of moisture and other active hydrogen donor materials, is readily extrudable and otherwise conventionally moldable thermoplastic composition. Upon exposure to moisture, however, the composition becomes essentially thermoset.

According to another embodiment, the invention provides a system for forming EMI shielded enclosures. The system includes a support platform, a compound applicator nozzle located above and in register with the platform, a supply of electrically conductive compound connected to the applicator nozzle, and a drive mechanism for moving the nozzle or platform relative to each other in one or more directions of travel. A curing chamber for curing the compound, after application, can be provided.

According to yet another embodiment, the invention provides a process for forming a form-in-place conductive EMI shielding gasket or a substrate that includes the steps of providing a substrate to be gasketed, providing a supply of conductive gasket material, applying the material to the substrate's surface in a predetermined pattern, and curing the material in place upon the substrate.

According to one aspect of all the embodiments herein, a primerless form-in-place gasket is provided. These and other objects of the invention will become clear from the following description and claims.

DETAILED DESCRIPTION OF THE INVENTION

The present invention relates to a form-in-place EMI gasket. Such gaskets are useful when positioned between two adjacent substrates such as a boxed cover, so as to form an electrical bridge or continuity between the two substrates and thereby prevent or reduce the potential for EMI.

Figure 1:
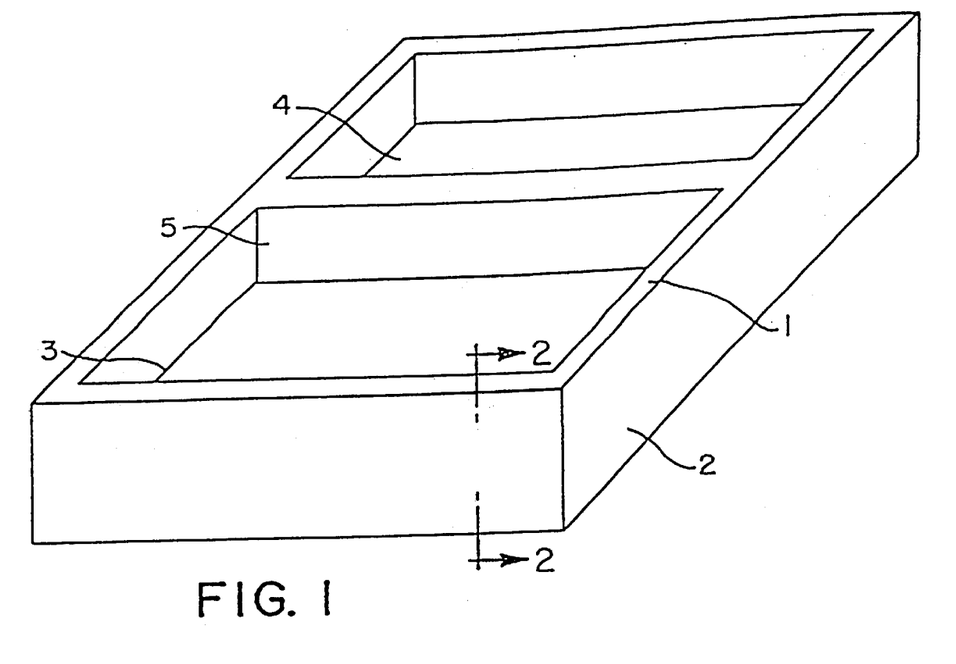
FIG. 1 illustrates in planar view a preferred configuration of a form-in-place conductive EMI gasket, having a complex physical structure comprising a series of elongated sections in the x-y axis, on a desired substrate.

FIG. 1 shows a preferred embodiment of the present invention. The form-in-place conductive gasket 1 is mounted on a preselected section or sections of a substrate 2 which is to be shielded. In FIG. 1, the substrate 2 is a modular enclosure formed of two compartments 3, 4 separated by a wall 5. Such an enclosure can be a cellular phone carcass, a switching box, hard disk drive case, etc. As can be seen, the gasket 1 is formed in place along the edges of the enclosure which will mate with a cover (not shown).

Figure 2:
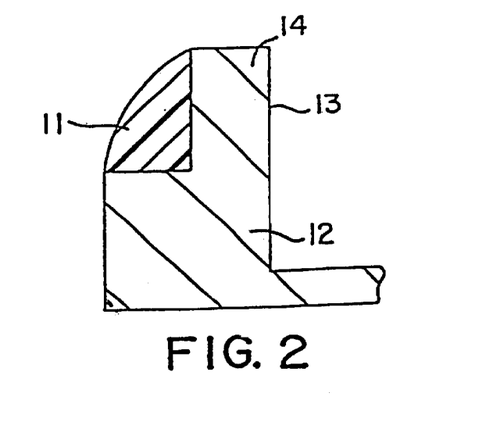
FIG. 2 shows in cross section a preferred embodiment of the gasket of FIG. 1.

FIG. 2 shows the conductive form in place gasket 11 in cross section as mounted to the enclosure 12. In this embodiment, the area of the enclosure to be gasketed 13 has a shoulder 14 against which the gasket is formed. Other embodiments may not have the shoulder 14, being flat instead, or may use other locating devices such as undercuts, dovetails, channels, etc. into which or against which the gasket may be formed.

The form-in-place gasket overcomes many of the problems of the prior approaches. It eliminates the necessity to form the gasket and then apply it in a separate step as occurs with the linear or die cut gaskets. It reduces waste as occurs with die cut or molded gaskets by being a flashless or scrapless process. It is less labor intensive than linear or die cut gaskets as there is no hand assembly of complex gasket shapes or mounting of the gaskets into place. Further, there is no need for the manufacture of specialized dies or molds which are useful for only one gasket configuration. That is, the gasket can be formed without applying pressure, for example with a mold, to a polymeric gasket precursor. The polymeric material that is the precursor is extruded onto a substrate, cured, and exhibits advantageous EMI shielding properties such as bulk resitivity of less than about 0.050 ohm cm.

The gasket can be applied to any substrate, in any configuration, easily and in a cost effective manner with a minimal investment for tooling. Moreover, with the use of preprogrammable application equipment, one can store an infinite number of gasket configurations which can be called up and used quickly and repeatedly without the necessity to manufacture a specific die or a mold.

Additionally, it allows for the exact placement of very small diameter gaskets (e.g. 0.030 inch diameter or less) which is difficult to achieve with all but molding.

The word "elastomeric" should be given its usual meaning given the purpose for which the invention is intended. The elastomer bases used in the invention can be thermosetting resins; e.g. resins which to cross-link and subsequently cure either at a critical temperature or in the presence of a curing agent/catalyst such as peroxide, photoinitiator, moisture, etc. Any flexible thermosetting elastomer base is suitable for use in the invention, such as EPDM copolymers, silicone rubbers, fluorosilicone rubbers, urethane rubbers, nitrile, rubbers, butyl rubbers, and mixtures thereof.

Elastomeric thermoplastics may also be used. Thermoplastic rubbers, such as various block copolymers (KRATON™ rubber, NORPRENET™ resin or SANTOPRENE™ resin) are particularly useful. Omission of other elastomers is not meant to specifically exclude their use in the invention. Certain physical or electrical requirements of the application for which the gaskets are intended may dictate that particular elastomeric compositions be used.

The selected material is preferably a fluent, hardenable polymeric material. By this definition is meant a polymeric material that has viscosity characteristics as described above, that can be readily extruded from an extrusion nozzle. The fluent polymeric material preferably has the following representative flow rate characteristics as described below, when the material Is extruded through an 0.033 in. orifice (18 gauge needle), at 20 psi the range of flow rates are (depending on changes in viscosity) 0.03–014 gm/min; at 40 psi the range of flow rates are 0.05–0.25 gm/min at 60 psi, the range of flow rates are 0.10–046 gm/min. When the material is extruded through a 0.054 in orifice (15 gauge needle) at 20 psi the range of flow viscosity rates were 0.06–0.49 gm/min while at 40 psi the range is 0.19–1.25 gm/min and at 60 psi the range is 0.36–2.62 gm/min. The fluent, polymeric material should be sufficiently viscous and/or form stable so that it does not slump, sag or run between the time of application and the time of curing. It may be in the form of a paste, a caulk, a gel or viscous fluid. Alternatively, when the material has a fast curing cycle or creates an initially stable material such as a gel or a skinned or foam structure upon application, the material as applied can be a relatively thin or non-viscous fluid.

In addition, the selected resin should form a soft, resilient, compression set resistant gasket even with the addition of relatively highloadings of conductive fillers, if used.

Preferred elastomers that meet the requirements above include silicone rubbers, whether foamed or unfoamed; silicone gels, whether foamed or unfoamed, typically such gels are relative soft silicone rubber which may have been extended with oils or plasticizers or which are only lightly cross-linked; polyurethanes, especially the prepolymer type of urethane in which the prepolymer is capped or terminated with an isocyanate group which when exposed to an activating agent (typically a hydroxy containing group), such as water, amines or alcohols cause the prepolymer to a crosslink; elastomeric thermoplastic rubbers such as DYNAFOAM™ and NORPRENE™ from Norton Co.; SANTOPRENE™ resin from Monsanto, and KRATON™ rubber from Shell Oil. These thermoplastics generally comprise at least a block copolymer, such as SBS or SIS rubber with or without other polymers (polyethylene, polystyrene, etc.) and/or oils or plasticizers. Additionally, various blends of the elastomers can be used as well.

Such polymers are generally known and widely available, see e.g. U.S. Pat. Nos. 4,931,479, 4,643,924 and EP Patent Application 0326704A.

An EMI gasket can be formed of a composition as taught by EP Patent Application 0326704A by using a two-component polymer system, one which is thermoplastic in nature, the other being thermoset when exposed to moisture or active hydroxyl groups. According to one embodiment the gasket includes the following three components. The first component is a primary polymer having end groups that are capable of chemically reacting with each other in the presence of moisture to form a derivative polymer having a longer average chain length than said primary polymer, such as an isocyanide capped polyester prepolymer. The second component is a noncross-linked elastomer that is not substantially chemically reactive with itself or with said first component in the presence of moisture, such as a block copolymer e.g. styrene-butadiene-styrene block copolymers. The third component is one or more electrically conductive fillers. The first, the second, and the third components are intimately mixed, and the composition, when maintained in the absence of moisture and other active hydrogen donor materials, form a readily extrudable and otherwise conventionally moldable or coatable thermoplastic composition but, upon exposure to moisture, becomes essentially thermoset. One preferred embodiment of the invention utilizes thermal addition cure systems.

Silicone-based polymeric materials suitable for use include those available from Dow Corning Corporation as SYLGARD™ 527 (Parts A and B), DOW CORNING 3146, those available from GE Silicone as one-part RTV silicone material including primerless adhesive RTV 6802, 6803, 6808, 6809, general purpose adhesive RTV 6702, 6703, 6708, fast-curing primerless adhesive RTV 5812, 5813, 5818 and two-part RTV materials, also Shin-Etsu (Torrance, Calif.) selfpriming (primeness) KE 1800 T, KE 109 RTV silicones (2-component) or KE 1820, KE 1830. A suitable material can be mixed with one or more conductive fillers to form an EMI material.

The gasket may be rendered electrically conductive either through the use of a conductive filler incorporated into the elastomer base and/or the use of an electrically conductive outer layer formed over a core which may be conductive or nonconductive.

The fillers that are used to impregnate elastomers to make them electrically conductive are well-known in the art. Examples of these fillers include but are not limited to electrically conductive noble metal-based fillers such as pure silver; noble metal-plated noble metals such as silver plated gold; noble metal-plated non-noble metals such as silver plated copper, nickel or aluminum, for example, silver plated aluminum core particles or platinum plated copper particles; noble-metal plated glass, plastic or ceramics such as silver plated glass microsperes, noble-metal plated alumina or noble-metal plated plastic microspheres; noble-metal plated mica; and other such noble-metal conductive fillers. Non-noble metal-based materials are also suitable, including non-noble metal-plated non-noble metals such as copper-coated iron particles or nickel plated copper; non-noble metals, e.g. copper, aluminum, nickel, cobalt; non-nobel-metal-plated-non metals, e.g., nickel-plated graphite and non-metal materials such as carbon black and graphite combinations of the fillers to meet the desired conductivity, hardness and other parameters desired for a particular application.

The shape and size of the electrically conductive fillers is not critical to the present invention. The fillers may be of any shape that is generally used in the manufacture of conductive materials, including spherical, flake, platelet, irregular or fibrous (such as chopped fibers). In making gaskets in accordance with the invention it is preferred that the particle shape be spherical, substantially spherical or irregular. Flake or platelet shaped fillers are preferred when used in forming an outer conductive coating for the foam-in-place gasket.

The particle size of the electrically conductive fillers can be within the range normally used for fillers in conductive materials. Generally the particle size of the one or more fillers is from about $0.250\mu$ to about $250\mu$, preferably from about $0.250\mu$ to about $75\mu$, and most preferably from about $0.250\mu$ to about $60\mu$.

The fluent, hardenable polymeric material of the invention has a viscosity of from about 100,000 to about 10,000,000 centipoise. Viscosity is measured at 25° C. using a Brookfield Viscometer (RV series) Heliopath Stand, "F" T-Spindle (1–2.5 RPM), Brookfield Engineering Labs, Inc., Stoughton, Mass. Viscosity can be adjusted by, for example, addition of a silicone fluid.

The amount, or loading, of the one or more electrically conductive fillers in the conductive elastomeric material used in the present invention can vary over a wide range, as long as the electrically conductive filler is present in an amount sufficient to provide EMI/RFI shielding properties. Generally loading of the filler particles in the conductive elastomeric material is from about 10 to about 80 volume percent, preferably from about 20 to about 66 volume percent.

When a conductive outer layer is used to provide the conductivity to the gasket, it may be in the form of a plating, a coating or a film. Plated layers, such as silver plating, are not preferred as the platings tend to be rigid and crack under compression. Films, such as a conductive filled polyethylene or polyimide, may be used.

Preferably, the outer conductive layer is some form of conductive coating. More preferably it is a conductively filled resilient coating. Such coatings can and preferably are based upon the same elastomer resin that is used to form the inner layer. Preferred coatings include silicone, polyurethane, acrylic and epoxy resins filled with one or more of the conductive fillers in the same size range and amounts as described above.

Other fillers and ingredients may also be added to the elastomer base if desired. Such fillers include microwave absorbing materials, thermally conductive fillers, inert or reinforcement fillers such as silicas and pigmentation fillers, also glass or polymeric microspheres. Additionally, curing agents, cross linking agents, flame retardants, diluents, solvents or dispersion aids, etc., may be added as is well known in the art to form the desired conductive elastomeric material. The elastomers may in addition comprise other compounds, such as plasticizers, extender oils, softeners, tackifiers catalysts, blowing agents or other agents that impart desired properties to the cured gasket.

Typically, the gasket should have a SHORE A hardness (as measured by ASTM standards) of less than 90, preferably between 5 and 80, more preferably 5 and 50 and more preferably between 5 and 40. The properties of the gasket will vary depending upon the resin chosen, whether it is foamed or not, the amount of filler contained therein and the other constituents (oils, plasticizers, reinforcing fillers etc.) that may be added.

A typical form-in-place gasket should have a low closure force, e.g. a force of less than about 5 pounds/linear inch, preferably less than 3 pounds, and more preferably less than 1 pound to deflect the gasket sufficiently to ensure proper electrical continuity between the two adjacent substrates.

The gasket should be capable of being dispersed by automated equipment (if so desired) in diameters ranging from about 0.010 to 0.25 inch wide and aspect ratios as from about 0.25 to 1 to about 3 to 1.

EMI Shielding effectiveness should be at least 10 dB, preferably at least 20 dB over a range of frequencies from about 10 MHz to 12 GHz. More preferably, it should provide an EMI shielding effectiveness of from about 10 dB to 120 dB, preferably from about 20 dB to 80 dB, over a frequency range of from about 10 MHz to 12 GHz, preferably from about 200 MHz to 10 GHz. Shielding effectiveness will of course vary with the amount of conductive material present, the deflection imposed upon the gasket and the test method used. All shielding effectiveness values above assume a typical loading of conductive materials as referenced above, with at least 10% deflection, preferably 10 to 50% deflection and standard MIL-G-83528 test procedures.

The process of applying such form-in-place conductive elastomers preferably includes the use of automated equipment such as robotic applicators, such as x-y, x-y-z and other such multiaxis or rotational type of applicators; hand applicators such as caulking guns; transfer applicators and other such processes.

Preferably, the process relates to the formation of an elastomer which is capable of being formed in place, applying the elastomer to a substrate along a predetermined pathway and curing the elastomer in place. This means that a free-form polymeric material, for example a free-form polymeric thermal addition cure system, is extruded onto a substrate and cured. "Free-form" means that the extrudate assumes a desired shape and is cured without the use of a mold. The extrudate can be cured without a mold as well, preferably at atmospheric pressure.

According to a preferred embodiment, excellent adhesion of the materials and gaskets of the invention to substrates onto which they are applied and cured is realized without the use of primer. If desired or required, however, due to the elastomer resin selected and/or its adhesion to a certain substrate, a bonding agent or primer may be used. For example, some silicone compositions are known to have poor adhesion properties, especially to metal substrates. A primer, such as a functionalized silane, silicate ester, a cyanurate or a silicone based adhesive may be used to cause the silicone composition to adhere to the metal substrate. In the preferred embodiments, even when primeness materials are used the force of cohesion within the gaskets formed is less than the large force of adhesion to the underlying substrate. Thus good bonding to substrates is obtained.

One preferred process is to use a stationary support or table to which the substrate to be gasketed is fixed in place. A movable applicator, such as a programmable x-y or x-y-z nozzle, which is connected to a supply of form in place elastomer, is positioned adjacent and preferably above the substrate and then caused to travel along a predetermined path, applying the elastomer to the portion of the substrate over which it travels in a desired amount. The elastomer then is cured.

Alternatively, the nozzle may be stationary and the table may be caused to move in two (x-y), three (x-y-z) or more planes of movement.

In a further embodiment, both the nozzle and the table may move in one or more planes relative to each other. One example is where the nozzle moves in two planes (x-y) and is rotational as well and the table is capable of vertical (z) movement. Other variations and embodiments can be used as well.

Figure 3:
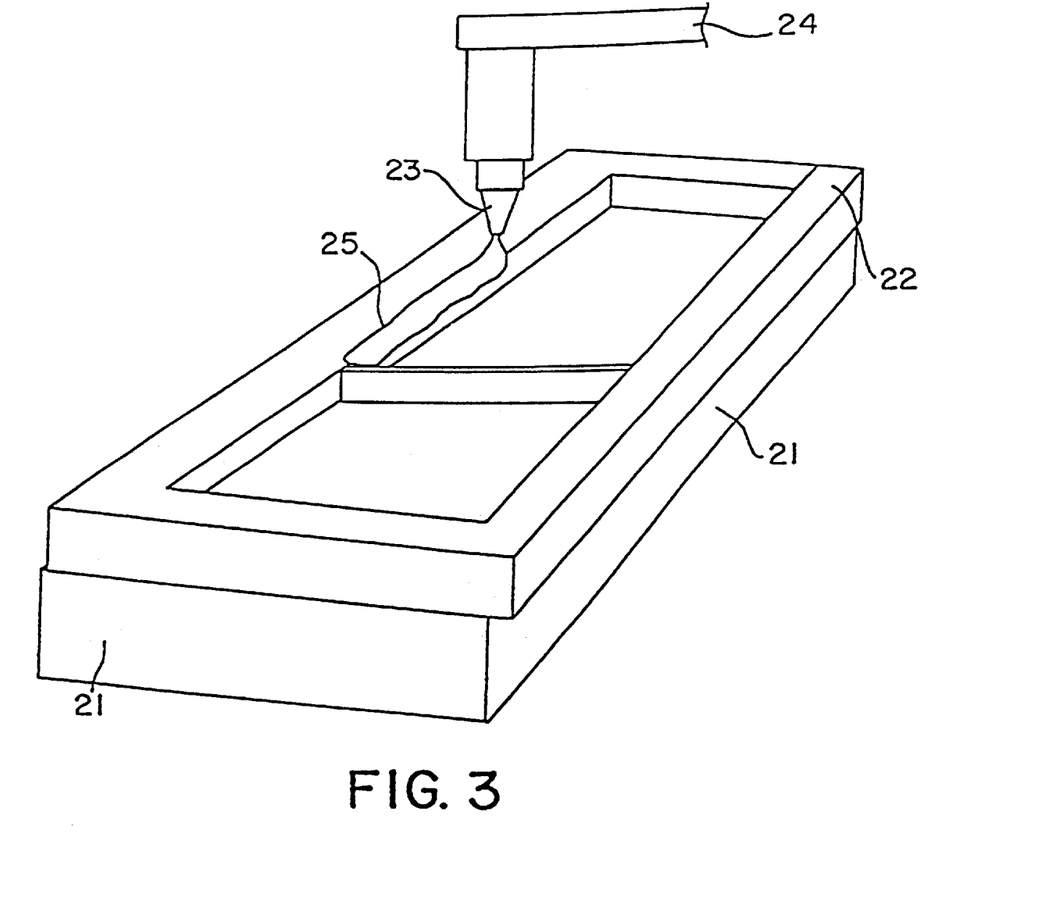
FIG. 3 shows in planar view a preferred system for forming-in-place an EMI gasket, according to the present invention.

A typical system for performing the process is shown in FIG. 3 wherein a support platform or table 21 has a substrate to be gasketed 22 mounted upon it. An applicator, such as the lining dispenser 23 is located over the platform 21. The dispenser is connected to a supply (not shown) of form in place elastomer via a conduit 24.

The dispenser 23 is capable of moving in at least two planes of motion relative to the platform, such as in the x and y axes. Preferably, it is capable of moving in three planes of motion (x, y, z) and may also be rotational so as to accommodate changes in the height or the angle of the substrate 21 over which it passes and applies the elastomer to form a gasket 25 at a desired position.

Figure 4:
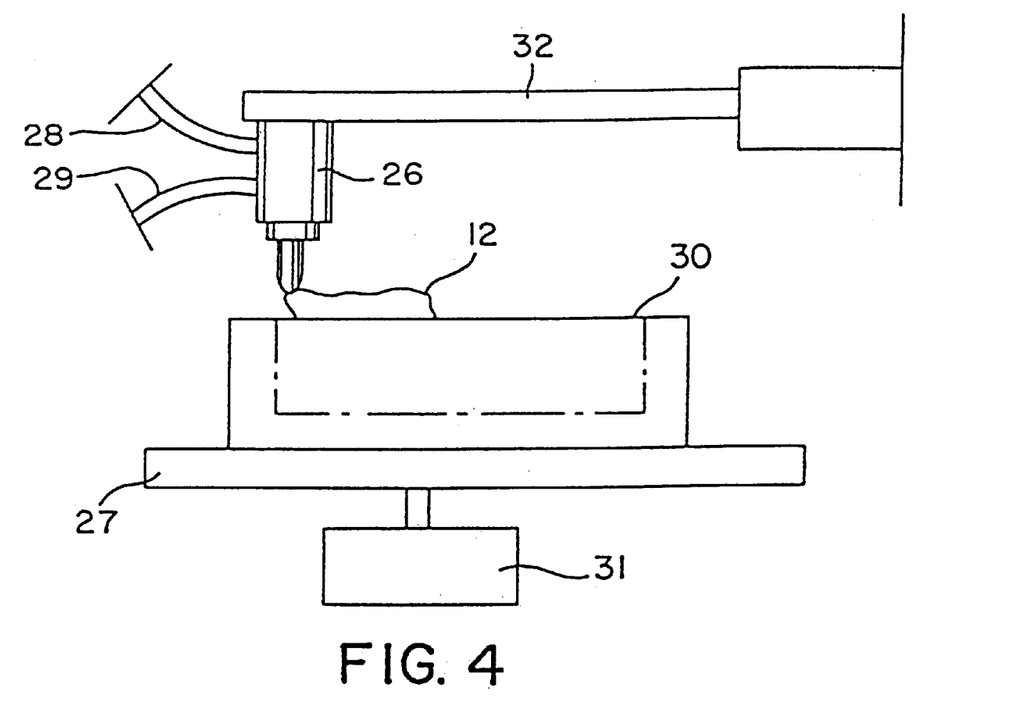
FIG. 4 shows another embodiment of a system of the present invention in cross section.

FIG. 4 shows another typical system in which the dispenser 26 and the table 27 move relative to each other. Also in this instance, the nozzle has two supply lines 28, 29 which allows for the use of two component systems such as urethanes or the introduction of a gaseous component (air, C02, nitrogen) into the elastomer just before application so as to form a foamed structure. The table 27 to which the substrate 30 is mounted is moved in one or more directions (x, y and/or z) by a drive mechanism as represented by box 31. The nozzle is moved via a similar drive mechanism 32.

One method of forming the form in place gasket is to mix a silicone rubber, preferably in the form of a low Shore A siloxane polymer with electrically-conductive filler in an amount sufficient to provide EMI shielding. The mixture is then mixed with additional silicone rubber and/or a curing agent or catalyst and then added to a syringe applicator mounted on an x-y applicator arm. The material is then dispersed along a peripheral edge of a substrate, such as a cellular phone housing where it cures in place.

Figure 5:
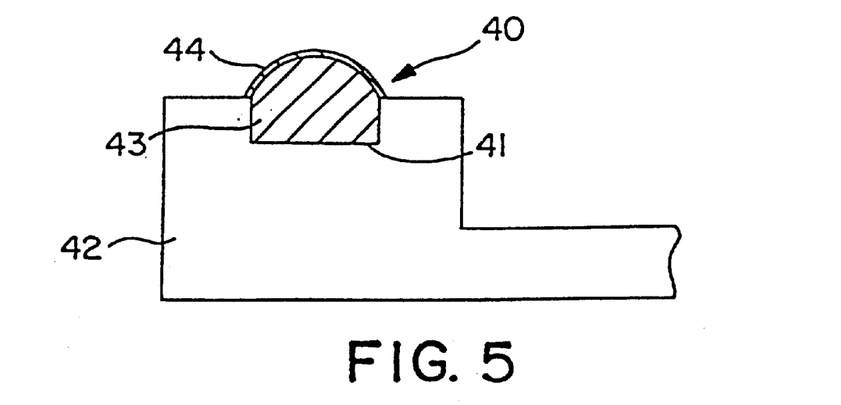
FIG. 5 shows a cross section of another preferred embodiment of the present invention.

Another method is to form a nonconductive elastomer gasket layer, such as by the process described above and then forming a conductive outer layer over the nonconductive core via spraying, coating, painting or dipping a conductive outer layer onto the core. FIG. 5 shows such an embodiment. The gasket 40 is contained in a channel 41 formed in a substrate 42. The inner layer 43 is covered at least partially with a conductive outer layer 44. The inner layer 43 is preferably nonconductive. However, if desired, it could be conductive, containing e.g. carbon black as a filler.

Alternatively, the nonconductive core can be coated with an adhesive layer which then is flocked with conductive fibers, as taught by U.S. Pat. No. 5,115,104, which is incorporated herein in its entirety.

The gasket may be cured by any of the mechanisms commonly used for the selected polymer so long as the cure does not adversely affect the slump properties of the gasket between application and cure, and/or the physical or electrical properties of the cured gasket.

Some elastomers such as prepolymer based polyurethanes are basically selfcuring in that once the reaction between the isocyanate group and hydroxy group begins, it typically continues until one or both groups are expended.

Other elastomers, such as some silicone and thermoplastic rubbers use chemical curing agents such as peroxide, sulfur, zinc or amines and/or heat to cross-link and cure the resin.

Photocurable resins may also be used via the incorporation of a light sensitive curing agent or photoinitiator which upon exposure to a certain wave length of light (UV, etc.) causes the resin to cross-link and cure.

Some resins use heat to cure. In a particularly preferred embodiment of the invention, a polymeric thermal addition cure system in the form of a hardenable fluent polymeric extrudate is cured in an oven. In addition, in heat cure systems one may warm a substrate before, during or after application (especially if it is metal) of hardenable fluent polymeric material in order to hasten the cure and avoid problems of a cool substrate coating as a heat sink and drawing away heat from the resin. Alternatively, the resin can be heated in an extruder container or passage such as a nozzle just before application. The use of hot air or infrared heaters adjacent the substrate may be used.

Hot melt resins such as those based upon KRATON™ rubbers typically need to cool in order to set. Affirmative cooling of the substrate in this instance may be useful. Those hot melts which contain a cross-linking agent may actually need to be kept at an elevated temperature (albeit it below the melting point of the resin) in order to cross-link.

In accordance with a particularly preferred embodiment of the invention, a polymeric thermal addition cure system, and an electrically-conductive filler, form an EMI shielding material which can be extruded and then heat cured. Polymeric thermal addition systems are known, and many such systems suitable for use in the invention are cured through reaction between functional groups on adjacent molecules, which functional groups and molecules can be the same or different. For example, the invention finds utility with a single species that is a polymer that can be cross linked, chain extended, or both.

First and second species having first and second functional groups, respectively, can be reacted as well to cure and harden a fluent polymeric material. The first species is generally polymeric, and the second species a cross linker, although both the first and second species can be polymeric. The first and second species have adequate functionality such that a thermally-activated cross linking reaction results in hardening of the material to an extent that a gasket having mechanical properties desirable in an EMI shielding gasket results.

The first species is preferably a polymeric species of a size and structure that results in the material being fluent and extrudable, generally with a viscosity of from about 5,000 poise to about 10,000 poise at 25° C. The polymeric species can be a linear, branched, or radial homopolymer, random copolymer, or block copolymer, including polymeric species described above, and can include terminal reactive functional groups, internal (non-terminal) reactive functional groups, or both. The first species can include phenylmethylvinyl and divinylmethyl materials. According to a particularly preferred embodiment, the first species is a linear vinyl-terminated siloxane polymer, such as vinyl-terminated polydimethyl siloxane, and the second species is as hybrid cross-linker such as a hydride terminated siloxane, or a methylhydrodimethylsiloxane copolymer with 20–60% methyl hydrogen. A catalyst, such as a platinum catalyst, typically is necessary to catalyze the addition cure reaction between the first and second species. Platinum catalysts are known to those of ordinary skill in the art, typically embodied as organoplatinum species.

Siloxane-based polymeric thermal addition cure systems are commercially available, for example from Dow Chemical, GE Silicone, or Shin-Etsu Company: Such systems are generally sold as a two-component system, the first component including a vinyl-containing siloxane and about 5–10 ppm platinum catalyst, and the second component containing a hydride functional siloxane and a vinyl-containing siloxane. The first and second components are mixed and heat cured, resulting in a form-stable material.

The polymeric thermal addition cure system becomes essentially thermoset upon exposure to a temperature of at least 85° C. for a period of time of at least 30 min. Typically, temperatures of from about 85° C. to about 180° C. are employed, and heat is applied to the system for period of time ranging from about 30 minutes to about 160 min. Preferred systems are cured at about 150° C. for about 30 minutes, at about 120° C. for about 60 minutes, or at about 85° C. for about 120 minutes. Those of skill in the art can adjust the time and temperature of curing to suit a particular system. For example, if a temperature as high as 250° C. is used, the curing time may be as short as 1–5 minutes.

Preferred polymeric addition cure systems, such as siloxane-based systems, will adhere to a substrate upon which they are cured without the use of a primer. Substrates to which the system will adhere when cured thereon include plastics, metals, ceramics, silica, and the like.

In accordance with the invention, an electrically-conductive material is mixed with the first and second components of a two-component thermal addition cure system, and when the components are mixed and heat cured, a form-stable EMI shielding material results. When a silver-based electrically-conductive material (such as silver powder, silver-plated metal, ceramic or polymeric particles, or silver-impregnated particles) is used, however, the silver acts to adversely affect the catalytic activity of the catalyst, especially a platinum catalyst. Therefore, when the above-described first and second pre-mixed component are stored, over time the silver-based filler inhibits the platinum catalyst to adversely affect the catalytic activity of the catalyst. Thus, the replenishment of catalyst is controlled in accordance with the invention to counteract the conductive filler poisoning of the catalyst resulting from storage and use of the system.

According to a particularly preferred embodiment of the invention, a method involves providing several pre-mixed components and mixing together the components to form EMI shielding material that can be extruded to form a gasket. The components are formulated such that predetermined amounts of each are blended together prior to extrusion, where the predetermined amounts are conveniently deliverable and blendable. For example, the components can be prepared such that a ratio of the first to the second of approximately 1:1 can be blended prior to extrusion.

A three-component system is provided that includes one pre-mixed component that can include the first species, the electrically-conductive filler, and the catalyst. A second component can include the first species, the second species, and toe electrically-conductive filler. A third component can be provided that includes the catalyst in a suitable carrier, such as a silicone fluid or silicone-compatible fluid, an organic solvent such a toluene, alcohol, or the like, or one of the first or second species. A cure accelerator, such as sold by Dow Corning as Q3-6559, as well as other cure accelerators having relatively high catalyst content, is suitable for use as the catalyst-replenishing third component. The method can involve mixing the first and second components together and then adding the third component prior to extrusion or mixing the first component with the third component, then adding the second component prior to extrusion. While not preferred, the second and third components can be mixed, followed by addition of the first component prior to extrusion.

According to another embodiment of the invention, a two-component system is provided that includes one pre-mixed component that can include the first species, the second species, the electrically-conductive filler, the catalyst, and an inhibitor. The inhibitor prevents reaction between the first and second species at room temperature, but at curing temperatures is volatilized, allowing reaction between the first and second species. A second component includes the catalyst in a suitable carrier. According to this embodiment, when a hydride-containing siloxane is used in the curing reaction, it is advantageously replenished if the system is stored for longer than one day. The amount of hydride needed to replenish the system is dependent upon the length of time of storage. According to this embodiment, the method involves mixing the first and second components together just prior to extrusion.

According to one embodiment, polymeric microspheres can be added to the polymeric addition cure system prior to curing. Such polymeric microspheres are known in the art and are formed of phenolic material, acrylonitrile-based material, or the like, depending upon the physical properties desired. Such microspheres can be made to be compressible, such that upon compression the viscosity of material containing the sphere drops. The spheres can also be made to contain a volatile species such as a hydrocarbon core contained within a polymeric shell, and upon exposure to heat, the hydrocarbon expands to expand the sphere. Acrylonitrile microspheres of 5–200 micron size, averaging 25 microns, are suitable for use in the invention.

The description above, and that which follows, is only meant to describe particularly advantageous embodiments of the present invention and as such is only meant to illustrate, not limit it.

EXAMPLE 1

Part A contains:
22.4 parts of silicone resin (Dow Corning 527 Part A)
77.6 parts of silver plated glass spheres, (avg. size 30–50 microns)
Part B contains:
22.3 of silicone resin (Dow Corning 527 Part B)
0.4 of hydride-terminated siloxane (Dow Corning 184 Part B)
77.3 of silver plated glass spheres (30 to 50 microns average).

Part A and Part B are mixed separately by hand until each is homogenous. Then equal parts are added and mixed by hand until homogenous.

The mixed material is added to a 10 cc syringe with a needle tip of 0.033 diameter. The syringe is mounted onto a dispensing head of a CAM-A-LOT™ Model 1818 x-y Positioning/ Dispensing System. The material is forced out of the syringe via air pressure of about 90 psi in programmed patterns onto an aluminum flange (3 inches diameter, 0.25 inch thickness) which is mounted on a stationary table. The sample is cured in a hot air circulating oven for 60 minutes at 100° C.

The flange is cooled and placed in an Instron machine in a modified ASTM D-575 Compression Testing fixture. Electrodes are placed into the flange opposite facing aluminum surface and the sample is compressed at a rate of 0.005 inch/minute to a total compression of 50% of the original gasket height. During compression, stress, strain and resistivity values are recorded.

Following the compression testing, the flange is removed and bolted to a second flange (with no gasket) until the gasket is compressed to 50% its original height. The assembly is heated in a hot air circulating oven for 22 hours at 85° C. The sample is removed, disassembled and allowed to cool and recover for 30 minutes. The gasket height is remeasured and compression set calculated as:

$$\% \text{ set} = \frac{\text{Original height} - \text{Final height}}{\text{Original height} - \text{Deflected height}}$$

The results of those tests are shown in Table 1.

EXAMPLE 2

A conductive particle-filled, foamed silicone gasket is prepared and tested in the manner set forth in Example 1.

The Components of Example 2 are:
Part A—21.6 Silicone RTV Foam (Dow Corning RTV silicone foam #3-6548 A/B)
  75.7 Silver Powder (325 mesh)
  2.7 Toluene
Part B—21.4—Silicone RTV Foam (Dow RTV #3-6548 A/B)
  74.9—Silver Powder
  1.1—Hydride terminated siloxane (Dow Corning 184 Part B)
  2.6—Toluene
The results are shown in Table 1.

EXAMPLE 3

A conductive coating over a nonconductive underlayer form-in-place gasket is prepared as follows:

The underlayer is prepared and applied as taught in Example 1. The underlayer or core comprises:
Part A—84.2—Silicone RTV Foam (Dow RTV #3-6548 A/B)
  10.5—Cab-o-Sil (silica)
  5.3—Toluene
Part B—80.8—Silicone RTV Foam (Dow RTV #3-6548 A/B)
  4.0—Hydride terminated siloxane (SYLGARD™ 184B)
  10.1—Cab-o-Sil (silica)
  5.1—Toluene After formation and cure, a conductive coating formed of silicone RTV, catalyst, solvent and silver coated glass conductive filler is applied by brush to the outer surfaces of the underlayer.

The coating is comprised of two parts:
Part A—11.5—RTV Silicone
  4.71—Silver Powder
  11.8—Silver Flake
  29.6—Toluene
Part B—100 RTV Silicone The Parts are mixed in a ratio of 100 Part A to 1.21 Part B (by weight).

The results are shown in Table 1.

EXAMPLE 4

A stock, linear piece of conductive gasket, known as CHO-SEAL™ 1350 gasket, available from Chomerics, Inc. and formed of a conductively filled silicone rod, 0.060 inch in diameter is tested for compression and resistivity values. The results are shown in Table 1.

EXAMPLE 5

A conductive flocked form-in-place is formed of a urethane under layer applied and cured as described in Example 1. The outer layer of the urethane under layer is coated with a flocking adhesive which in turn is covered by a silver plated nylon flock as taught by U.S. Pat. No. 5,115,104 which is incorporated by reference in its entirety. The flocked gasket is placed in a hot air circulating oven for 10 minutes at 200° F. to cure the adhesive. The flocked gasket is found to provide EMI shielding over a wide range of frequencies.

EXAMPLE 6

A urethane form-in-place conductive gasket is prepared, assembled and tested according to the procedures of Example 1.

The gasket is formed of:
100 grams—urethane prepolymer
3 grams—activator
360 grams—silver powder
1.5 grams—silica (as a reinforcing filler)

The gasket is applied to and adhered to a substrate. The gasket is found to provide adequate EMI shielding over a wide range of frequencies.

EXAMPLE 7

An EMI shielding gasket is formed by extruding from an extrusion head a fluent polymeric material that is a blend of a three-component polymeric thermal cure system including electrically-conductive filler particles.

The three-component system is formulated as follows. A first pre-mixed component is a 12.25 parts/wt vinyl terminated siloxane polymer and platinum catalyst containing 48 parts/wt silver-plated copper particles (electrically-conductive particles), and 0.2 parts/wt 25 $\mu$ acrylonitrile microspheres. A second pre-mixed component is a mixture of a 12.5 parts/wt hydride-terminated siloxane polymer and vinyl-terminated siloxane polymer, 48 parts/wt silver-plated copper particles, 0.2 parts/wt 25$\mu$ acrylonitrile microspheres, and 0.2 parts/wt fumed silica. The first and second components, absent the microspheres, the electrically-conductive particles, and the fumed silica, are available commercially from Dow Corning as SYLGARD™ 527A and 527B. In other examples, GE Silicone 6196 (Parts A and B), or Shin-Etsu KE 1800T and KE 109 RTV silicones, respectively, are used. Into the first and second components is mixed a third component that is 0.25 parts/wt of a cure accelerator containing a platinum catalyst, available from Dow Corning as Q3-6559, and 0.75 parts/wt of a silicone fluid, available from Dow Corning as low-viscosity 200 fluid.

Figure 6:
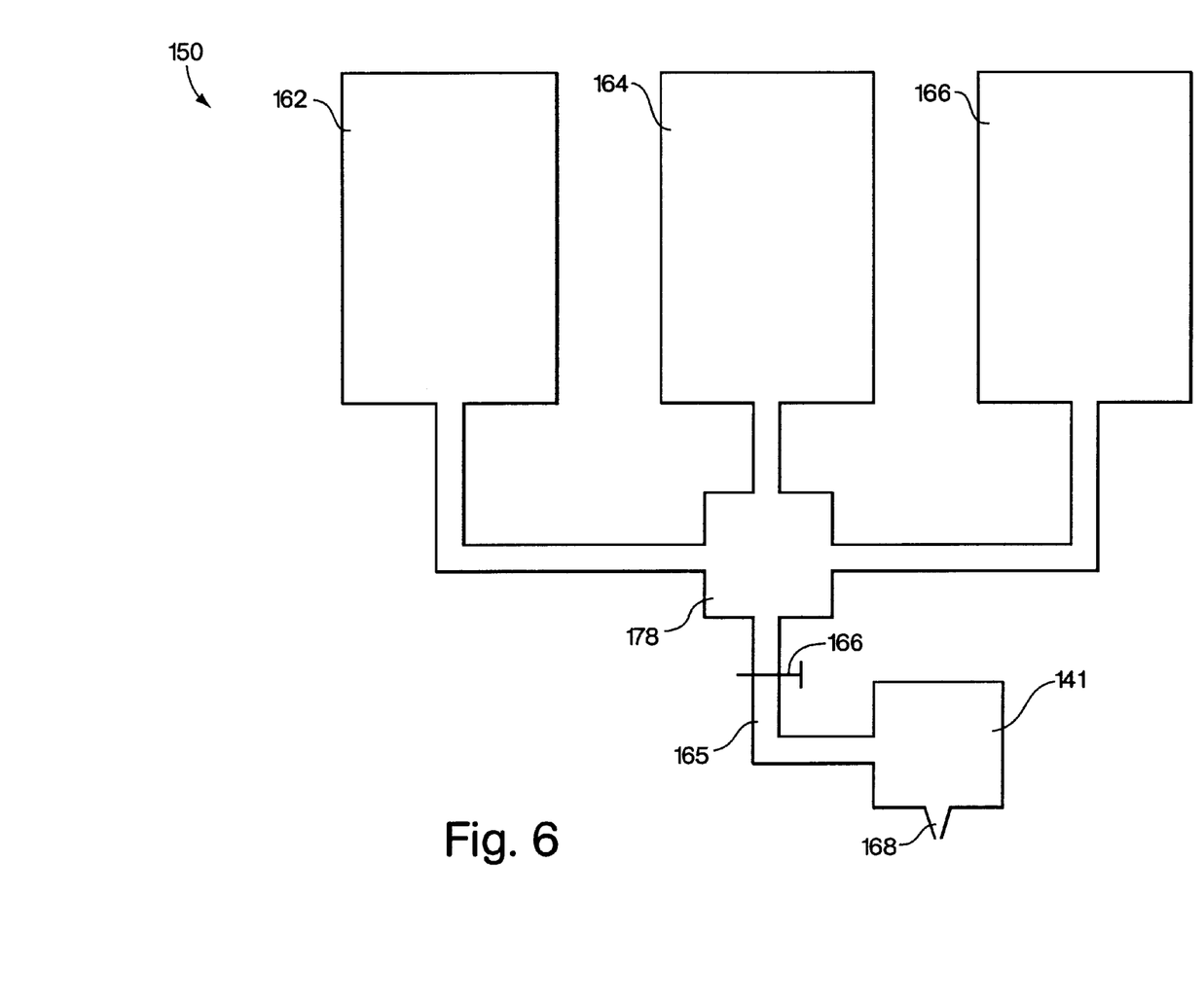
FIG. 6 is a schematic illustration of an extruder apparatus.

Referring to FIG. 6, predetermined quantities of each of the first, second, and third components are loaded into containers 162, 164, and 166, respectively, of a representative material supply and extrusion system 150. A predetermined amount of material is fed into a mixing chamber 178 and mixed in a dynamic mixing process, to form a hardenable, fluent polymeric material. The percentages by volume of the first, second, and third components added to form the fluent, polymeric mixture are approximately 19, 19, and 1, respectively. The first and third components (in containers 162 and 166, respectively) can be mixed prior to addition of the second component.

The fluent polymeric material then flows through a conduit 165 when a valve 166 is opened. The valve 166 controls the amount of material which flows into an extruder chamber 141. After a predetermined amount of material is fed into the extrusion chamber 141, the valve 166 can be shut, and the material is extruded out of an extruder head 168.

Figure 7:
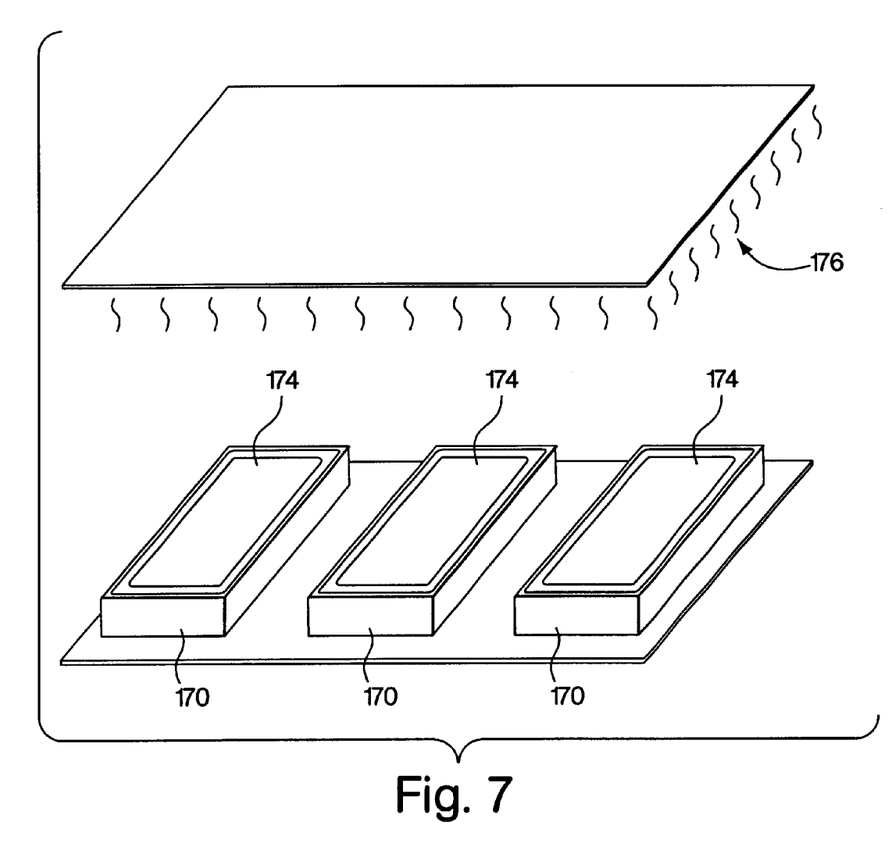
FIG. 7 is a representation of a process of forming a bead on a substrate and heat curing the bead.

Referring to FIG. 7, a heat-curing system is illustrated schematically. Several independent substrates 170 are supported by a pallet 172. Beads 174 have been formed onto the substrates 170 with use of the apparatus illustrated schematically in FIG. 6. Beads 174 each have a cross-sectional area of from about 0.0004 in$^2$ to about 0.015 in$^2$. Pallet 172 is positioned in an oven and heat cured at a temperature 138° C. for one-half hour. The oven is illustrated schematically at 176. After heat curing, substrates 170 carrying beads 174 are cooled to room temperature.

U.S. patent application Ser. No. 08/119,403, filed Sep. 10, 1993 and entitled "Form-In-Place EMI Gaskets" is incorporated herein by reference in its entirety.

What is claimed is:

1. A method of making a form-in-place elastomeric EMI shielding gasket, comprising:
    extruding onto a substrate to be gasketed a free-form polymeric thermal additional cure system having a viscosity of from about 100,000 to about 10,000,000 centipoise, and including a resin selected from the group consisting of silicone, siloxane, thermoplastic elastomers and mixtures thereof and an electrically-conductive filler; and
    curing the system under atmospheric pressure, thereby forming a gasket having bulk resistivity of less than about 0.050 ohm cm, a force/deflection value of from about 35 N/m to about 267 N/m, a shore A hardness of at most about 90 and a closure force of at most about 5 pounds/linear inch.

2. A method as in claim 1, further comprising prior to the extruding step:
    forming the polymeric thermal addition cure system by forming a mixture of a first species having a first functional group, a second species having a second functional group that is reactive with the first functional group in the presence of a catalyst and heat, a catalyst that catalyzes a reaction between the first and second functional groups, and the electrically-conductive filler.

3. A method as in claim 2, wherein the forming step comprises:
    mixing together:
        a first pre-mixed component including the first species, the electrically-conductive filler, and the catalyst; and
        a second pre-mixed component including the first species, the second species, and the electrically-conductive filler.

4. A method as in claim 3, further comprising:
    prior to mixing together the first and second components, adding additional catalyst to the first pre-mixed component.

5. A method as in claim 2, the catalyst having catalytic action that in the presence of heat catalyzes a reaction between the first and second functional groups, and the electrically-conductive filler inhibiting the catalyst to adversely affect the catalytic activity of the catalyst.

6. A method as in claim 2, wherein the first species comprises a siloxane polymer including vinyl functional groups, the second species comprises a siloxane cross-linker including reactive hydrides, the electrically-conductive filler comprises a silver-based electrically-conductive filler, and the catalyst comprises a platinum catalyst.

7. A method as in claim 1, wherein the electrically-conductive filler is a silver-based filler.

8. A method as in claim 1, wherein the catalyst is a platinum catalyst.

TABLE 1

| EXAMPLE | FORCE/DEFLECTION (lb/inch) | | | | Electrical Resistance (ohms) at stated Force/Deflection (lb/inch) | | | | Compression Set (%) |
|---|---|---|---|---|---|---|---|---|---|
| | 10% | 20% | 30% | 40% | 10% | 20% | 30% | 40% | |
| #1 | .5 | 1.5 | 2.7 | 4.3 | .060 | .020 | .011 | .007 | 13 |
| #2 | .7 | 2.2 | 4.0 | 6.2 | .050 | .010 | .007 | .002 | 50 |
| #3 | .3 | 1.3 | 2.5 | 4.0 | .063 | .024 | .018 | .016 | 41 |
| #4 | 2.4 | 4.9 | 8.4 | 13.7 | .037 | .016 | .010 | .007 | 30 |

9. A method as in claim 1, the system further comprising a cure inhibitor.

10. A method as in claim 1, the system further comprising polymeric microspheres.

11. The method as in claim 1, wherein the polymeric thermal addition cure system and the substrate are essentially free of primer.

12. The method as in claim 1, said extruding step comprising extruding onto a substrate the polymeric thermal addition cure system in the form of a bead having a cross-sectional area of from about 0.0004 in$^2$ to about 0.15 in$^2$.

13. The method as in claim 1, wherein said heating step is carried out at atmospheric pressure.

14. An EMI shielding gasket formed by the process of claim 1.

15. The method according to claim 1, wherein the curing step includes curing the system to form a gasket having a shore A hardness of from about 5 to about 80.

16. The method according to claim 1, wherein the curing step includes curing the system to form a gasket having a shore A hardness of from about 5 to about 40.

17. The method according to claim 1, wherein the curing step includes curing the system to form a gasket having a closure force of at most about 3 pounds/linear inch.

18. The method according to claim 1, when the curing stop includes curing the system to form a gasket having a closure force of at most about 1 pound/linear inch.

19. The method according to claim 1, wherein the curing step includes curing the system to form a gasket in a shape of a bead having a cross-sectional area of from about 0.004 square inches to about 0.015 square inches.

20. A process for forming a form-in-place conductive EMI shielding gasket on a substrate comprising the steps of:

providing a substrate to be gasketed;

providing a supply of conductive gasket material comprising a conductive filled resin selected from the group consisting of silicone, siloxane, thermoplastic elastomers and mixtures thereof;

applying the free-form material to the substrate's surface in a predetermined pattern; and curing the material in place upon the substrate under atmospheric pressure to form a gasket having a shore A hardness of at most about 90, a force/deflection value of from about 35 N/m to about 267 N/m and a closure force of at most about 5 pounds/linear inch.

21. The process of claim 20 further comprising, prior to the applying step applying a primer to the substrate.

22. The process of claim 20 wherein the gasketing material is formed of a conductive filled resin, the fillers being selected from the group consisting of noble metal fillers; carbon black and graphite and combinations thereof; and the substrate is an electrically conductive material selected from the group consisting of metals, metal composites, metal coated plastics and metal laminates.

23. The process of claim 20 wherein the curing occurs via a curing agent, a cross linking agent, heat, light, moisture or combinations thereof.

24. The method according to claim 20, wherein the curing step includes curing the system to form a gasket having a shore A hardness of from about 5 to about 80.

25. The method according to claim 20, wherein the curing step includes curing the system to form a gasket having a shore A hardness of from about 5 to about 40.

26. The method according to claim 20, wherein the curing step includes curing the system to form a gasket having a closure force of at most about 3 pounds/linear inch.

27. The method according to claim 20, wherein the curing step includes curing the system to form a gasket having a closure force of at most about 1 pound/linear inch.

28. The method according to claim 20, wherein the curing step includes curing the system to form a gasket in a shape of a bead having a cross-sectional area of from about 0.004 square inches to about 0.015 square inches.

* * * * *